United States Patent
Chin

(10) Patent No.: US 7,075,285 B2
(45) Date of Patent: Jul. 11, 2006

(54) DELAY LOCKED LOOP CIRCUIT AND METHOD FOR TESTING THE OPERABILITY OF THE CIRCUIT

(76) Inventor: Richard Chin, 307 Quinnhill Ave., Los Altos, CA (US) 94024

( * ) Notice: Subject to any disclaimer, the term of this patent is extended or adjusted under 35 U.S.C. 154(b) by 0 days.

(21) Appl. No.: 10/844,068

(22) Filed: May 12, 2004

(65) Prior Publication Data

US 2005/0253572 A1    Nov. 17, 2005

(51) Int. Cl.
*G01R 23/175* (2006.01)
*G01R 31/08* (2006.01)

(52) U.S. Cl. .................... 324/76.54; 324/527

(58) Field of Classification Search ............ 324/76.52, 324/76.53, 76.77, 76.78, 527, 76.35
See application file for complete search history.

(56) References Cited

U.S. PATENT DOCUMENTS

| | | | |
|---|---|---|---|
| 4,068,105 A * | 1/1978 | Jain et al. ..................... | 714/43 |
| 5,815,016 A * | 9/1998 | Erickson ..................... | 327/158 |
| 6,115,305 A * | 9/2000 | Pathak et al. ................ | 365/201 |
| 6,437,553 B1 * | 8/2002 | Maloney et al. ......... | 324/76.35 |
| 6,486,651 B1 * | 11/2002 | Lee et al. ................. | 324/76.53 |
| 6,690,216 B1 * | 2/2004 | Lutkemeyer ................. | 327/161 |
| 6,759,911 B1 * | 7/2004 | Gomm et al. .................. | 331/10 |
| 6,777,946 B1 * | 8/2004 | Ott ............................. | 324/434 |
| 6,815,986 B1 * | 11/2004 | Roy et al. .................... | 327/149 |
| 2004/0012420 A1 | 1/2004 | Roy et al. | |

* cited by examiner

Primary Examiner—Anjan Deb
Assistant Examiner—John Zhu

(57) ABSTRACT

A delay locked loop (DLL) circuit and method for testing the operability of the circuit utilizes one or more test signal sources and a test signal receiver to selectively transmit test signals, for example, static test signals, through an array of delay elements of the DLL circuit. The resulting output signals of the array are used to determine whether any delay element or a tap selector of the DLL circuit has malfunctioned, e.g., stuck-at fault.

16 Claims, 5 Drawing Sheets

DELAY LOCKED LOOP CIRCUIT AND METHOD FOR TESTING THE OPERABILITY OF THE CIRCUIT

BACKGROUND OF THE INVENTION

Delay Locked Loop (DLL) circuits are used to generate one or more output clock signals with alternate signal edges from an input clock signal. DLL circuits are commonly used to provide high-frequency clock signals to support storage devices, such as Double Data Rate (DDR) memories. DLL circuits are also commonly used in serial interfaces such as in networking components.

A conventional DLL circuit of interest includes an array of identical delay elements, a phase comparator and a tap selector. The array of delay elements includes M rows (e.g., M=4) and N columns (e.g., N=64) of delay elements. The delay elements are configured such that the delay elements can be set to form an adjustable delay chain. The adjustable delay chain of delay elements allow an input clock signal to be routed through selected delay elements to produce output signals that are phase-shifted by predefined degrees at different locations along the delay chain. The delay chain is adjusted by the tap selector, which can set the delay elements on a particular column to a return state so that the input clock signal circumvents the delay elements that are positioned beyond this column. Thus, the delay chain can be shortened or extended by selecting a different column of delay elements. In order to determine the correct length for the delay chain, the tap selector adjusts the delay chain by sequentially applying different combination of tap signals to the columns of delay elements. Each combination of applied tap signals sets the delay elements of a particular column to the return state. When the proper or "locked" combination of tap signals is applied to the columns of delay elements, the correct phase-shifted output signals are produced. This locked combination of tap signals is determined using the phase comparator, which compares the phase of the input clock signal with the phase of the output signal that is to be phase-shifted by 360 degrees as the tap selector applies different combination of tap signals to the columns of delay elements. The "locked" combination of tap signals is found when the phase of the input clock signal is synchronized with the phase of the compared output signal.

A concern with the conventional DLL circuit is that the delay elements cannot be tested to determine whether any of the delay elements has malfunctioned, e.g., stuck-at fault. Similarly, the tap selector cannot be tested to determine whether any of the tap selection signals are stuck at a particular state.

In view of these concerns, there is a need for a DLL circuit and method for testing the circuit to detect malfunctioned delay elements and malfunctioned tap selector.

SUMMARY OF THE INVENTION

A delay locked loop (DLL) circuit and method for testing the operability of the circuit utilizes one or more test signal sources and a test signal receiver to selectively transmit test signals, for example, static test signals, through an array of delay elements of the DLL circuit. The resulting output signals of the array are used to determine whether any delay element or a tap selector of the DLL circuit has malfunctioned, e.g., stuck-at fault.

A delay locked loop circuit in accordance with an embodiment of the invention comprises an input, a test signal source, a switching mechanism, an array of delay elements and a test signal receiver. The input is connected to receive an input clock signal. The test signal source is configured to provide a test signal. The switching mechanism is connected to the input and the test signal source. The switching mechanism is configured to selectively transmit either the input clock signal or the test signal as a selected signal. The array of delay elements is connected to the switching mechanism to receive the selected signal. The delay elements are configured to selectively form a variable delay chain. The test signal receiver is connected to the array of delay elements to receive an output test signal from the array of delay elements. The output test signal provides information whether any of the delay elements is not properly operating.

A method for testing the operability of a delay locked loop circuit in accordance with an embodiment of the invention comprises controlling a tap selector of the delay locked loop circuit to apply tap signals to columns of an array of delay elements of the delay locked loop circuit to selectively set the delay elements to operating states such that a signal is expected to propagate from an input node of the array to an output node of the array along a signal path provided by the delay elements, applying a test signal to the input node of the array of delay elements, receiving an output test signal from the output node of the array of delay elements, and determining whether any of the delay elements is not properly operating using the output test signal.

Other aspects and advantages of the present invention will become apparent from the following detailed description, taken in conjunction with the accompanying drawings, illustrated by way of example of the principles of the invention.

DETAILED DESCRIPTION

Figure 1:
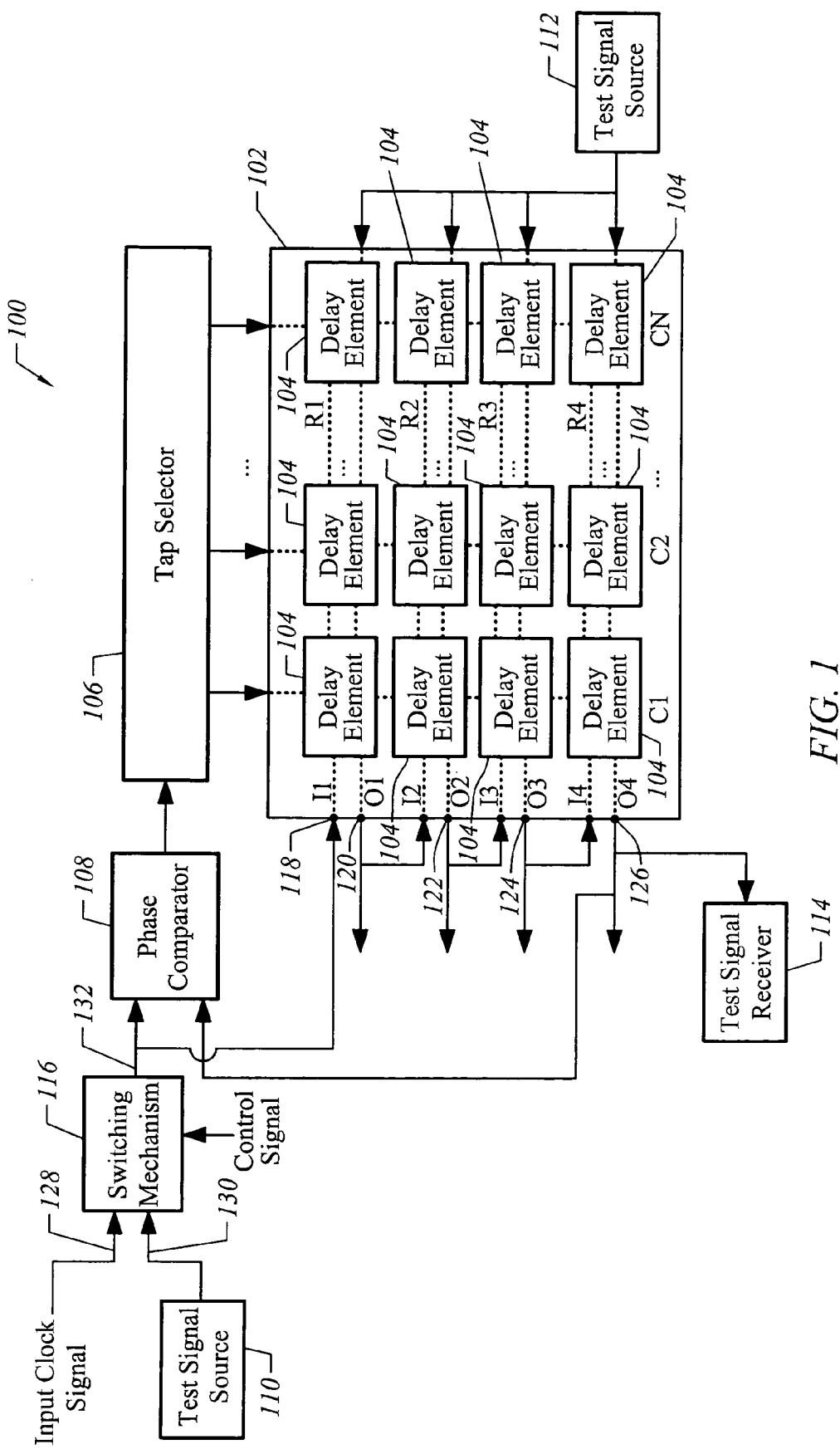
FIG. 1 is a diagram of a Delay Locked Loop (DLL) circuit with a test for operability feature in accordance with an embodiment of the invention.

With reference to FIG. 1, a Delay Locked Loop (DLL) circuit 100 in accordance with an embodiment of the invention is described. The DLL circuit 100 is designed with testability considerations, and thus, includes a test for operating feature, at minimal cost for additional test hardware resources. Consequently, the DLL circuit 100 can be tested for operability prior to being integrated into a larger system. The DLL circuit 100 can be used to generate multiple output clock signals with alternate signal edges using an input clock signal for use in storage devices, such as Double Data Rate (DDR) memories. However, the DLL circuit 100 can be used for other applications in which multiple output clock signals with alternate signal edges are required.

As shown in FIG. 1, the DLL circuit 100 includes an array 102 of delay elements 104, a tap selector 106 and a phase comparator 108. These components are used during a normal operational mode of the DLL circuit 100 to output phase-shifted or phase-delayed signals that are synchronized with an input clock signal. The phase-shifted output signals can then be used to produce a high-frequency clock signal. The DLL circuit 100 further includes test signal sources 110 and 112 and a test signal receiver 114. These components are used during a testing operational mode of the DLL circuit 100 to test the operability of the delay elements 104 and the tap selector 106. The DLL circuit 100 also includes a switching mechanism 116 to switch between the normal and testing operational modes.

The array 102 of delay elements 104 provides the necessary delay on an input clock signal to produce phase-shifted output signals, which are delayed versions of the input clock signal. In the illustrated embodiment, the delay element array 102 is used to produce quadrature output signals, which have phases that differ from the phase of the input clock signal by 90-degree increments. Thus, the output signals produced by the array 102 of delay elements 104 include a 90-degree phase-delayed output signal, a 180-degree phase-delayed output signal, a 270-degree phase-delayed output signal and a 360-degree phase-delayed output signal.

In the illustrated embodiment, the array 102 includes four rows R1, R2, R3 and R4 of delay elements 104 and N columns C1, C2 . . . CN of delay elements, where N is a predefined integer. As an example, N may be equal to 164, and thus, the array 102 may include 164 columns of delay elements 104. However, in other embodiments, the array 102 may include fewer or more rows and/or columns of delay elements 104.

The array 102 of delay elements 104 includes an input node 118 and output nodes 120, 122, 124 and 126. The input node 118 is used to receive an input clock signal during a normal operational mode. The output nodes 120, 122, 124 and 126 are used to output a 90-degree phase-delayed clock signal, a 180-degree phase-delayed clock signal, a 270-degree phase-delayed clock signal and a 360-degree phase-delayed clock signal, respectively. The delay elements 104 are interconnected such that the input clock signal can be propagated through all or selected delay elements 104 of the array 102, one row at a time. Each row of delay elements 104 includes an input I1, I2, I3 or I4 and an output O1, O2, O3 or O4, which are connected to the far left delay element of that row, i.e., the delay element of the column C1 for that row. The input I1 of the row R1 is connected to the input node 118 of the array 102, while the output O1 of the row R1 is connected to the output node 120. The output O1 of the row R1 is also connected to the input I2 of the row R2. Similarly, the output O2 of the row R2 is connected to the output node 122 and the input I3 of the row R3, and the output O3 of the row R3 is connected to the output node 124 and the input I4 of the row R4. The output O4 of the node R4 is connected to the output node 126. Since the outputs O1, O2 and O3 are connected to the inputs I2, I3 and I4, respectively, the input clock signal applied to the input node 118 can be successively propagated through all the rows of delay elements 104 in the array 102.

The delay elements 104 of the array 102 are interconnected such that the delay elements of each row can form a roundtrip signal path from the input of that row to the output of that row through a number of selected delay elements on that row. Since the input and the output of each row are both connected to the far left delay element 104, the roundtrip signal path runs through the selected delay elements in the forward direction and the return direction. The forward direction is the direction from column C1 to column CN, and the return direction is the opposite direction of the forward direction. The number of selected delay elements that form a roundtrip signal path on a row can be controlled, and thus, the length of the roundtrip signal path for that row can be varied.

The selected delay elements 104 that form a roundtrip signal path for each row are determined by the operating states of the delay elements on that row. The operating states of the delay elements 104 are controlled by tap signals applied to the columns of the delay elements from the tap selector 106. Each tap signal controls the operating states of all the delay elements 104 on the applied column. The operating states of the delay elements are described below along with a detailed description of one of the delay elements 104.

Figure 2:
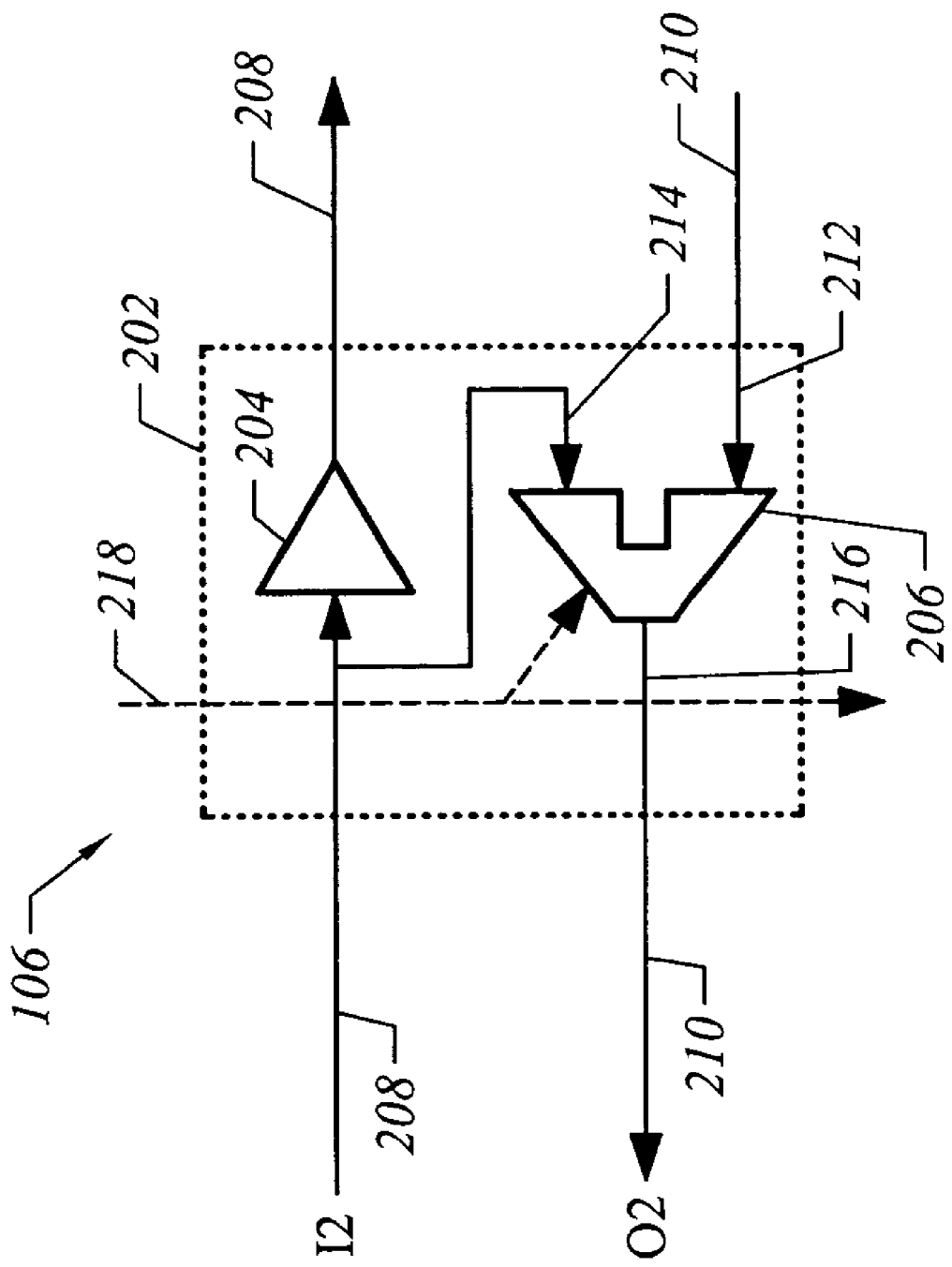
FIG. 2 is a diagram of an exemplary delay element included in the DLL circuit of FIG. 1.

In this embodiment, the delay elements 104 are identical, and their topological variations are sufficiently small. Consequently, each delay element provides the same delay on an input clock signal propagating through that delay element. Since the delay elements 104 are identical, only one of the delay elements is described herein in detail. In FIG. 2, an exemplary delay element 202 in accordance with an embodiment of the invention is shown. For illustrative purposes, the delay element 202 is assumed to be positioned on the row R2 of the array 102.

The delay element 202 includes a delay buffer 204 and a switching mechanism 206 in the form of a 2:1 multiplexer. The delay buffer 204 is positioned on a signal path 208 that extends from the input of the row on which the delay element is positioned, i.e., the input I2 of the row R2 for this example, to the far right delay element of this row. The signal path 208 is used to transmit signals in the forward direction through the delay buffer 204. The delay buffer 204 provides a predefined delay to the signals propagating through the delay buffer. The 2:1 multiplexer 206 is positioned on a signal path 210 that extends from the far right delay element of the row on which the delay element 202 is positioned. The signal path 210 is used to transmit signals in the return direction. The 2:1 multiplexer 206 includes two inputs 212 and 214 and an output 216. The input 212 and the output 216 of the 2:1 multiplexer are connected to the signal path 210. However, the input 214 of the 2:1 multiplexer 206 is connected to the signal path 208, prior to the delay buffer 204. The 2:1 multiplexer 206 can be switched between two settings to selectively transmit a signal on one of the inputs 212 and 214 to the output 216. The setting of the 2:1 multiplexer 206 is controlled by a "tap" signal 218 from the tap controller 106, which is applied to all delay elements on the same column as the delay element 202.

When the 2:1 multiplexer 206 is set to the first setting by a tap signal of a first state, e.g., a high "1" tap signal, the signal on the signal path 210 at the input 212 is transmitted to the output 216. This first setting of the 2:1 multiplexer 206 corresponds to a "pass" state for the delay element 202. In the pass state, the delay element 202 allows signals to pass through the delay element on the signal paths 208 and 210 in both directions. When the 2:1 multiplexer 206 is set to the second setting by a tap signal of a second state, e.g., a low "0" tap signal, the signal on the signal path 208 prior to the delay buffer 204, which appears at the input 214, is transmitted to the output 216. This second setting of the 2:1 multiplexer 206 corresponds to a "return" state for the delay element 202. In the return state, the delay element 202 redirects the signal on the signal path 208, prior to the delay buffer 204, to the signal path 210.

Turning back to FIG. 1, the tap selector 106 of the DLL circuit 100 is connected to the array 102 of delay elements 104 to provide tap signals. Specifically, the tap selector 106 is connected to the 2:1 multiplexers of the delay elements 104 to provide a particular tap signal to all the 2:1 multiplexers of the delay elements on each column of the array 102. As stated above, in order to produce the desired output signals on the output nodes 120, 122, 124 and 126, a "locked" combination of tap signals is applied to the columns of delay elements 102 so that an input clock signal is selectively delayed by the delay elements through which the input clock signal is propagated. As described below, this locked combination of tap signals is determined by applying different combination of tap signals to the columns of delay elements 104 and then repeatedly comparing the phase of one of the resulting output signals on the output nodes 120, 122, 124 and 126 with the phase of the input clock signal, which is performed by the phase comparator 108. After the "locked" combination of tap signal is determined, the "locked" combination of tap signals is stored in the tap selector 106, e.g., as a digital value.

The tap selector 106 can provide different combination of tap signals in a scanning manner such that a tap signal of the second state, e.g., a "0" tap signal, is sequentially applied to each column of delay elements 104 in the forward direction. As a particular column of delay elements 104 is applied with the tap signal of the second state, the remaining columns of delay elements are applied with tap signals of the first state, e.g., "1" tap signals. Thus, for each column of delay elements 104, the tap selector 106 is configured to switch between two states to provide either a low tap signal or a high tap signal to that column of delay elements.

The phase comparator 108 of the DLL circuit 100 operates to compare the phase of an input clock signal, which is applied to the input node 118 of the array 102, with the phase of the output signal on the output node 126 of the array to determine the "locked" combination of tap signals to produce the desired phase-shifted output signals. The desired phase-shifted output signals are produced when the phase of the output signal on the output node 126 is same as the phase of the input clock signal. The "locked" combination of tap signals is found by applying different combination of tap signals to the columns of delay elements 104 in a scanning fashion, as described above. When the phases of the output signal on the output node 126 and the input clock signal are the same, the combination of tap signals used to produce that output signal on the output node 126 is determined to be the "locked" combination of tap signals and stored in the tap selector 106. After the "locked" combination of tap signals is determined, the phase comparator 108 is no longer needed to continue producing the phase-shifted output signals on the output nodes 120, 122, 124 and 126.

The test signal sources 110 and 112 of the DLL circuit 100 provide test signals during a testing operational mode. The test signal source 110 is connected to the switching mechanism 116 to provide a test signal to the delay element array 102 via the switching mechanism 116. The test signal source 112 is directly connected to the rows of delay elements 104 to provide a test signal on the signal path in the return direction for each row of delay elements, such as the signal path 210 shown in FIG. 2. The test signal sources 110 and 112 provide one of two test signals, e.g., a high DC test signal and a low DC test signal. The test signal sources 110 and 112 may be logical circuits, such as flip-flops, to produce either a high or low static signal in response to a control signal. However, the test signal source 110 or 112 can be any element that can provide a static signal.

The test signal receiver 114 of the DLL circuit 100 is connected to the output node 126 of the delay element array 102 to receive an output test signal during a testing operational mode. The state of the output test signal, i.e., whether the output test signal is high or low, is used to determine the operability of the delay elements 104 and the tap selector 106. Similar to the test signal sources 110 and 112, the test signal receiver 114 may also be a logical circuit, such as a flip-flop, to indicate the state of the output test signal on the output node 126. However, the test signal receiver 114 can be any sampling storage element (e.g. a latch), as long as the sampled result can be extracted out (e.g. shift chains). In an embodiment, a single flip-flop may be used as the test signal source 110 and the test signal receiver 114. That is, the test signal source 110 and the test signal receiver 114 may be implemented as a single flip-flop.

The switching mechanism 116 of the DLL circuit 100 operates to selectively transmit either an input clock signal during a normal operational mode or a test signal during a testing operational mode. The switching mechanism 116 includes two inputs 128 and 130 and an output 132. The input 128 of the switching mechanism 116 is connected to receive an input clock signal, which is used to produce the phase-shifted output signals on the output nodes 120, 122, 124 and 126. The other input 130 of the switching mechanism 116 is connected to the test signal source 110 to receive a test signal. The output 132 of the switching mechanism 116 is connected to the phase comparator 108 and the input node 118 of the delay element array 102. The switching mechanism 116 can be switched between two states, a normal state and a testing state, by a control signal applied to the switching mechanism 116. In the normal state, the switching mechanism 116 selectively transmits an input clock signal on the input 128 to the output 132 so that the input clock signal is transmitted to the phase comparator 108 and the array 102 of delay elements 104. This normal state of the switching mechanism 116 is used during a normal operational mode of the DLL circuit 100. In the testing state, the switching mechanism 116 selectively transmits a test signal on the input 130 to the output 132 so that the test signal is transmitted to the phase comparator 108 and the array 102 of delay elements 104. This testing state of the switching mechanism 116 is used during a testing operational mode of the DLL circuit 100. The switching mechanism 116 may be a logical circuit, such as a 2:1 multiplexer, to selectively transmit a signal on one of the inputs 128 and 130.

The test signal sources 110 and 112 and the test signal receiver 114, along with the switching mechanism 116, allow the DLL circuit 100 to be tested for operability, including whether there are any "stuck-at faults" in the delay element array 102 or in the tap selector 106. The testing of the DLL circuit 100 for operability is performed after the DLL circuit has been manufactured and prior to the DLL circuit being integrated into a larger system. If the test determines that the DLL circuit 100 is not operable, then the DLL circuit can be discarded.

Figure 3A:
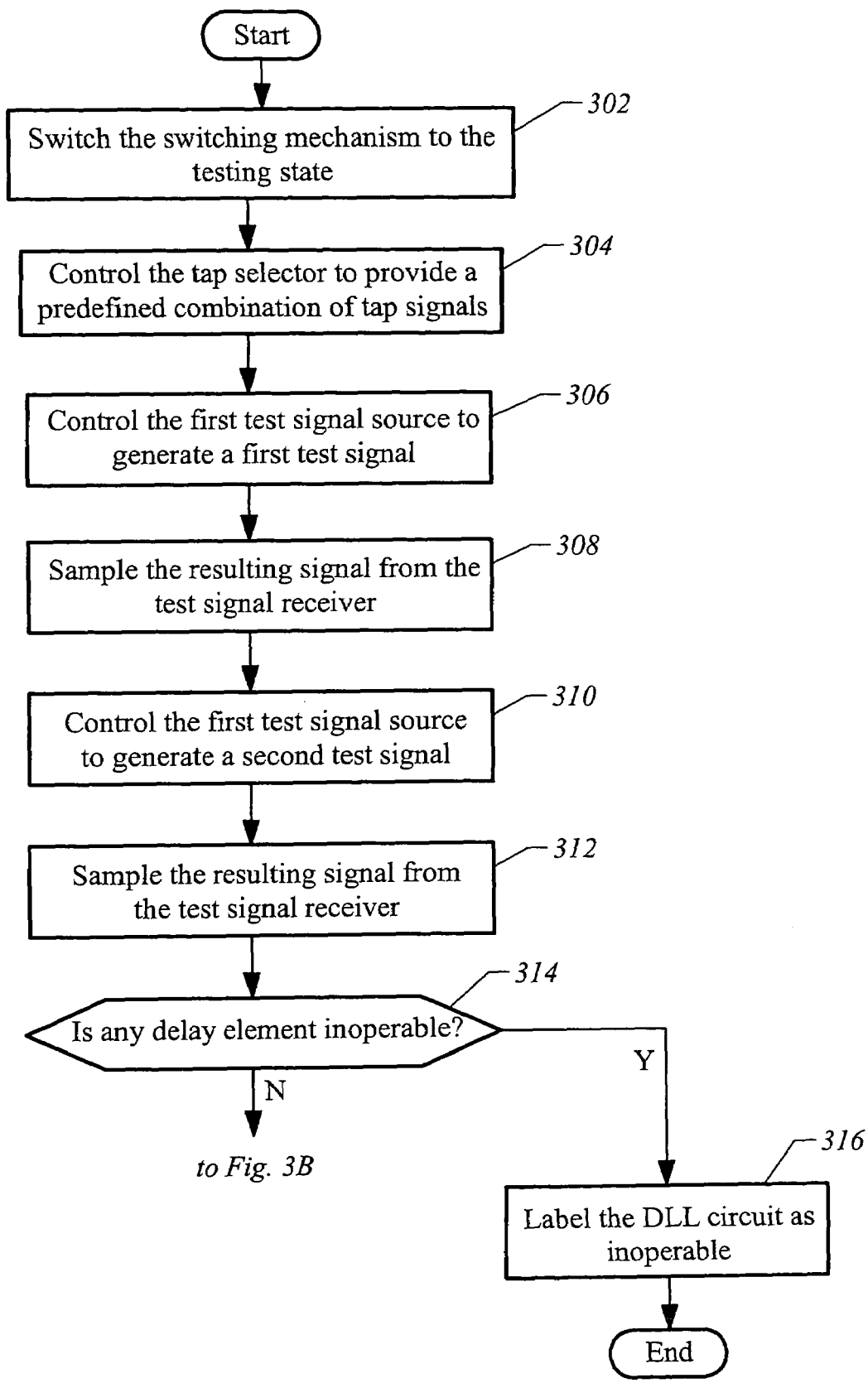
FIGS. 3A and 3B is a flow diagram of a test for operability process of the DLL circuit of FIG. 1.

The test for operability process of the DLL circuit 100 is now described with reference to a flow diagram of FIGS. 3A and 3B, as well as the diagrams of FIGS. 1 and 2. The test for operability process involves connecting the DLL circuit 100 to an external testing apparatus (not shown), which is configured to control the switching mechanism 116 and the test signal sources 110 and 112 of the DLL circuit 100, and to process a resulting signal from the test signal receiver 114 to determine whether the DLL circuit is operable. At an optional step 302, the switching mechanism 116 is switched to the testing state, if the switching mechanism 116 is currently in the normal state. Next, at step 304, the tap selector 106 is controlled to provide a predefined combination of tap signals to the columns of the delay elements 104 such that only the delay elements on the Nth column, i.e., the far right column, are set to the return state. As an example, the predefined combination of tap signals includes a single "0" tap signal in the form of "111 . . . 0". Thus, the serial signal path provide by the array 102 from the input node 118 to the output node 126 extends through all the delay elements 104 of the array.

Next, at step 306, the first test signal source 110 is controlled to generate a first test signal, which may be a high DC signal. Since the test signal source 110 is connected to the input 130 of the switching mechanism 116, the test signal is applied to the input node 118 of the array 102 through the switching mechanism 116. When the test signal is applied to the input node 118 of the array 102, the test signal is propagated through all the delay elements 104 of the array and transmitted to the output node 126 as an output test signal. The output test signal on the output node 126 is then transmitted to the test signal receiver 114, which output a resulting signal that indicates the state of the output test signal, i.e., whether the output test signal is high or low.

Next, at step 308, the resulting signal of the test signal receiver 114 is sampled by the external testing apparatus. Next, at step 310, the first test signal source 110 is controlled to generate a second test signal, which may be a low DC signal. Next, at step 312, the resulting signal of the test signal receiver 114 is sampled by the external testing apparatus.

Next, at step 314, a determination is made whether any delay element of the array 102 is inoperable, e.g., stuck-at fault, using the resulting signals from the test signal receiver 114. If the resulting signals from the test signal receiver 114 indicate that, in both instances, the output test signal on the output node 126 of the array 102 is same as the test signal applied to the input node 118 of the array, then it is determined that none of the delay elements is inoperable and the process proceeds to step 318, which is shown in FIG. 3B. However, if the resulting signals from the test signal receiver 114 indicate that, in either instance, the output test signal on the output node 126 of the array 102 is not the same as the test signal applied to the input node 116 of the array, then it is determined at least one of the delay elements 104 in the array is inoperable and the process proceeds to step 316, where the DLL circuit is labeled as being inoperable. The assumption is that an output test signal on the output node 126 that differs from the test signal applied to the input node 118 means that there is a break in the delay chain formed by all the delay elements 104 in the array 102. The process then comes to an end.

Figure 3B:
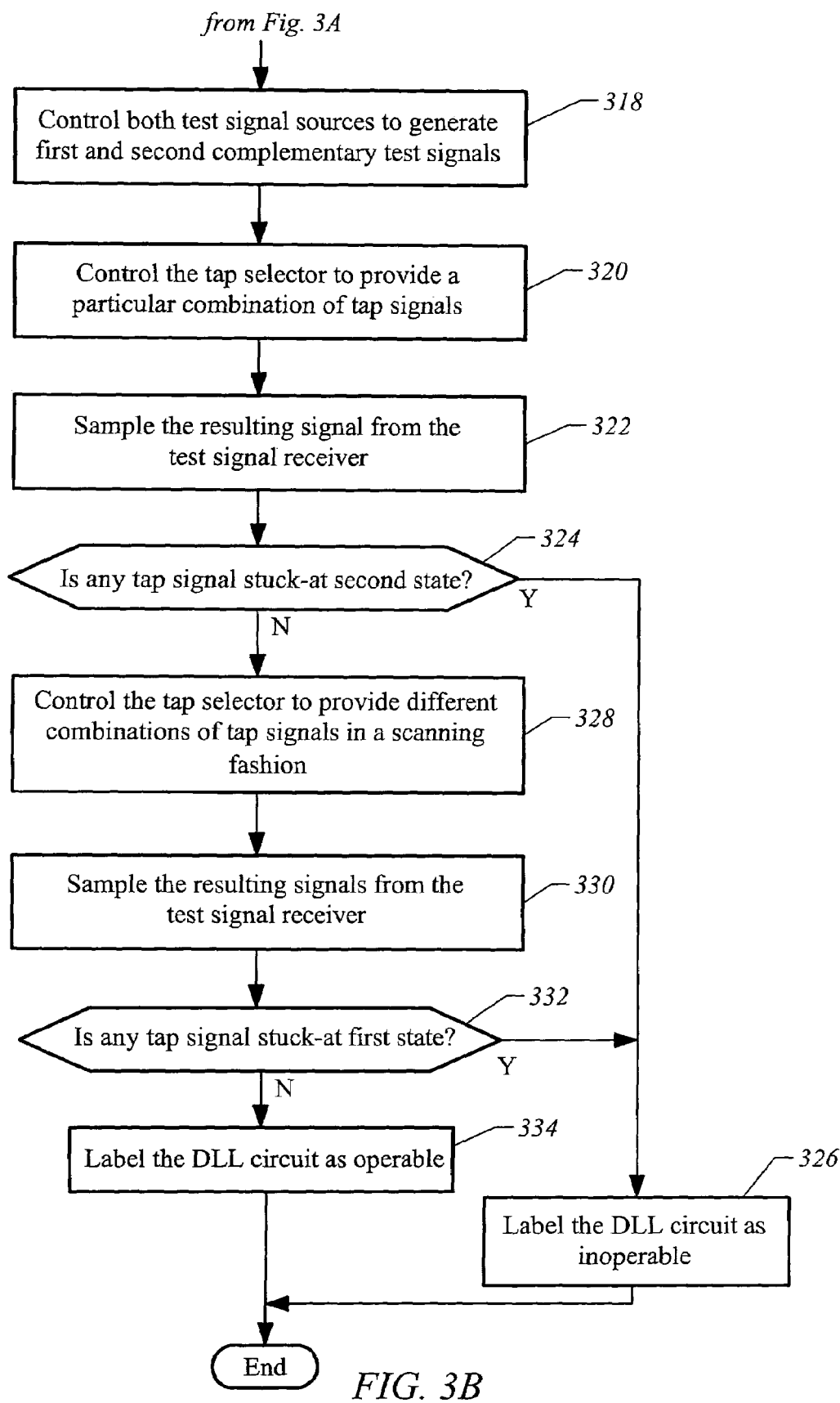

Turning now to FIG. 3B, at, step 318, the test signal sources 110 and 112 are both controlled to generate first and second complementary test signals, a high DC signal and a low DC signal. As an example, the test signal source 110 may be controlled to generate a high DC signal, while the test signal source 112 is controlled to generate a low DC signal. Next, at step 320, the tap selector 106 is controlled to provide a particular combination of tap signals such that each column of delay elements 104 is switched to the pass state from the first column of delay elements to the last (Nth) column of delay elements. As an example, "1" tap signals are applied to all the columns of delay elements 104. As a result of the applied tap signals, either the test signal from the test signal source 110 or the test signal from the test signal source 112 will appear at the output node 126 of the array 102 as an output signal.

Next, at step 322, the resulting signal from the test signal receiver 114 in response to the output test signal on the output node 126 of the array 102 is sampled by the external testing apparatus. Next, at block 324, a determination is made whether any of the tap signals provided by the tap selector 106 is stuck-at second state, e.g., stuck-at zero, using the resulting signal from the test signal receiver 114. If the tap selector 106 provides the correct tap signals so that the delay elements 104 of each column are properly switched to the pass state, the second test signal from the test signal source 112 will propagate through the row R4 of the delay elements and appear on the output node 126 of the array 102. However, if the tap selector 106 is stuck to generate only a tap signal of the second state, e.g., a "0" tap signal, for one or more columns of delay elements 104, the tap selector will not provide the correct tap signals. Consequently, the second test signal from the test signal source 112 will not propagate through the row R4 of the delay elements and appear on the output node 126 of the array 102. Instead, the first test signal from the test signal source 110 will appear on the output node 126 of the array 102. Thus, it can be determined whether any of the tap signals provided by the tap selector 106 is stuck-at second state by examining the resulting signal from the test signal receiver 114, which corresponds to the output signal on the output node 126 of the array 102.

If any of the tap signals provided by the tap selector 106 is determined to be stuck-at second state, the DLL circuit 100 is labeled as inoperable, at step 326, and the process comes to an end. However, if none of the tap signals provided by the tap selector 106 is determined to be stuck-at second state, the process proceeds to block 328.

At block 328, the tap selector 106 is controlled to provide different combinations of tap signals in a scanning fashion such that each column of delay elements 104 in the array 102 is sequentially switched to the return state from the first column of delay elements to the last (Nth) column of delay elements. As an example, an exclusive "0" tap signal is sequentially applied to each column of delay elements 104 from the first column of delay elements to the last column of delay elements, while "1" tap signals are applied to the remain columns of delay elements. For each combination of tap signals, an output test signal is generated on the output node 126 of the array 102, which is received by the test signal receiver 114.

Next, at step 330, the resulting signals from the test signal receiver 114 in response to the output test signals on the output node 126 of the array 102 are sampled by the external testing apparatus. Next, at block 332, a determination is made whether any of the tap signals provided by the tap selector 106 is stuck-at first state, e.g., stuck-at one, using the resulting signals from the test signal receiver 114. If the tap selector 106 provides the correct tap signals so that the delay elements 104 of each selected column are properly switched to the return state, the first test signal from the test signal source 110 will selectively propagate through each row of the delay elements up to the delay element on the selected column and appear on the output node 126 of the array 102. However, if the tap selector 106 is stuck to generate only a tap signal of the first state, e.g., a "1" tap signal, for the selected column of delay elements 104, the first test signal from the test signal source 110 will not selectively propagate through each row of the delay elements up to the delay element on the selected column and appear on the output node 126 of the array 102. Instead, the second test signal from the test signal source 112 will appear on the output node 126 of the array 102. Thus, it can be determined whether any of the tap signals provided by the tap selector 106 is stuck-at first state by examining the resulting signals from the test signal receiver 114, which correspond to the output signals on the output node 126 of the array 102.

If any of the tap signals provided by the tap selector 106 is determined to be stuck-at first state, the DLL circuit 100 is labeled as inoperable, at step 326, and the process comes to an end. However, if none of the tap signals provided by the tap selector 106 is determined to be stuck-at first state, the DLL circuit 100 is labeled as operable, at step 334, and the process comes to an end.

Figure 4:
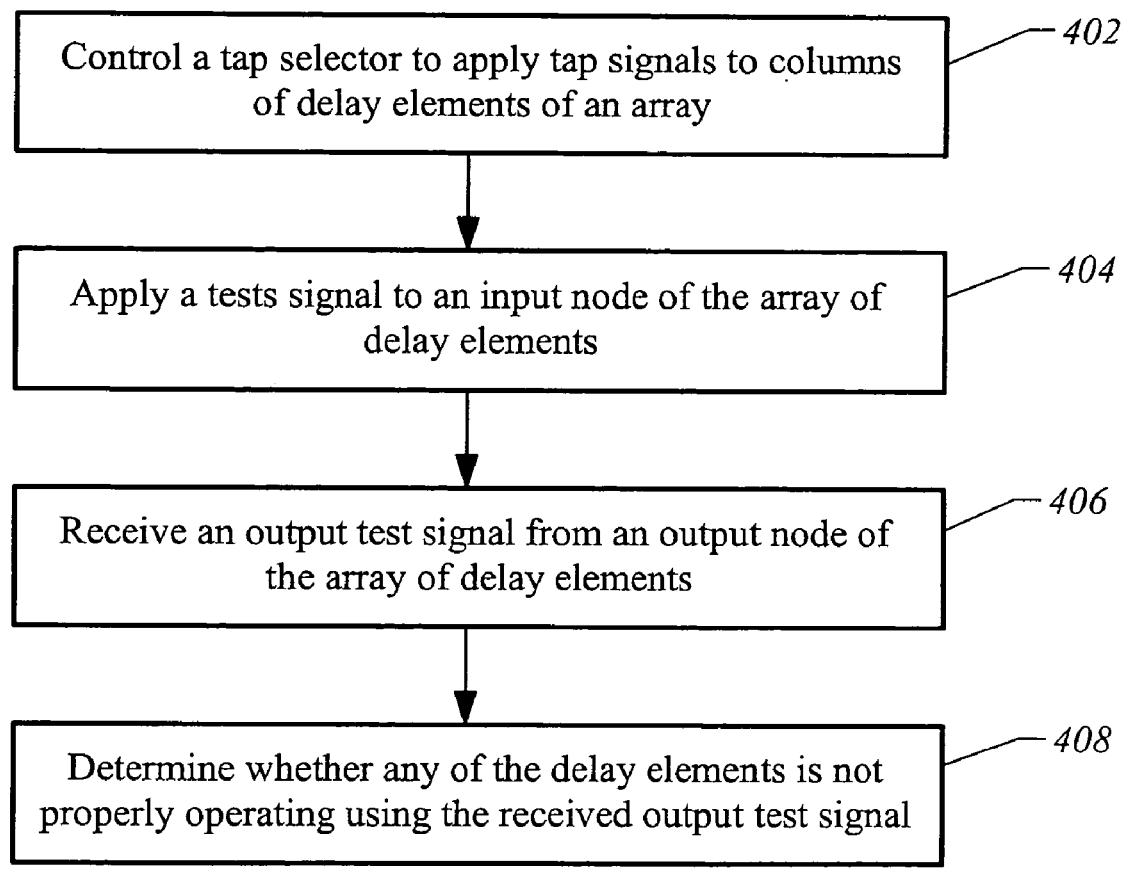
FIG. 4 is a flow diagram of a method for testing the operability of a DLL circuit in accordance with an embodiment of the invention.

A method for testing the operability of a DLL circuit in accordance with an embodiment of the invention is described with reference to a flow diagram of FIG. 4. At block 402, a tap selector of the DLL circuit is controlled to apply tap signals to columns of an array of delay elements of the DLL circuit. The tap signals are applied to selectively set the delay elements to operating states such that a signal is expected to propagate from an input node of the array to an output node of the array along a signal path provided by the delay elements. Next, at block 404, a test signal is applied to the input node of the array of delay elements. As an example, the test signal may be a high DC signal provided by a test signal source in the form of a flip-flop. Next, at block 406, an output test signal is received from the output node of the array of delay elements. Next, at block 408, a determination is made whether any of the delay elements is not properly operating using the received output test signal.

Although specific embodiments of the invention have been described and illustrated, the invention is not to be limited to the specific forms or arrangements of parts so described and illustrated. The scope of the invention is to be defined by the claims appended hereto and their equivalents.

What is claimed is:

1. A delay locked loop circuit comprising:
   an input to receive an input clock signal;
   a test signal source to provide a test signal;
   a switching mechanism connected to the input and the test signal source, the switching mechanism being configured to selectively transmit one of the input clock signal and the test signal as a selected signal;
   an array of delay elements connected to the switching mechanism to receive the selected signal, the delay elements being configured to selectively form a variable delay chain;
   a tap selector connected to the array of delay elements, the tap selector being configured to provide tap signals to columns of delay elements of the array;
   a test signal receiver connected to the array of delay elements to receive an output test signal from the array of delay elements, the output test signal providing information whether any of the delay elements is not properly operating; and
   a second test signal source connected to the array of delay elements, the second test signal source being configured to provide a second test signal to the rows of the delay elements of the array, the second test signal being differant from the test signal of the test signal source.

2. The circuit of claim 1 further comprising a phase comparator connected to the switching mechanism and the array of delay elements to compare the selected signal from the switching mechanism and an output signal from the array of delay elements, the phase comparator being also connected to the tap selector to inform the tap selector when phases of the selected signal and the output signal are sufficiently synchronized.

3. The circuit of claim 1 wherein the test signal source, the second test signal source and the test signal receiver include flip-flops.

4. The circuit of claim 1 wherein the test signal source and the test signal receiver are implemented as a single flip-flop.

5. The circuit of claim 1 wherein the switching mechanism includes a multiplexer having two inputs and a single output.

6. The circuit of claim 1 wherein each delay element of the array includes a delay buffer having an input and an output and a multiplexer having inputs and an output, the input of the delay buffer being connected to one of the inputs of the multiplexer.

7. A delay locked loop circuit comprising:
   an input to receive an input clock signal;
   means for providing a test signals from a test signal source;
   a switching mechanism connected to the input and the receiving means, the switching mechanism being configured to selectively transmit one of the input clock signal and the test signal as a selected signal;
   an array of delay elements connected to the switching mechanism to receive the selected signal, the delay elements being configured to selectively form a variable delay chain;
   a tap selector connected to the array of delay elements, the tap selector being configured to provide tap signals to columns of delay elements of the array;
   means for receiving an output test signal from the array of delay elements, the output test signal providing information whether any of the delay elements is not properly operating; and
   means for providing a second test signal from a second test signal source to the rows of the delay elements of the array, the second test signal being different from the test signal.

8. The circuit of claim 7 further comprising a phase comparator connected to the switching mechanism and the array of delay elements to compare the selected signal from the switching mechanism and an output signal from the array of delay elements, the phase comparator being also connected to the tap selector to inform the tap selector when phases of the selected signal and the output signal are sufficiently synchronized.

9. The circuit of claim 7 wherein the means for proving the test signal, the means for providing the second test signal and the means for receiving the output test signal include flip-flops.

10. The circuit of claim 7 wherein the means for providing the test signal and the means for receiving the output test signals are implemented as a single flip-flop.

11. The circuit of claim 7 wherein the switching mechanism includes a multiplexer having two inputs and a single output.

12. The circuit of claim 7 wherein each delay element of the array includes a delay buffer having an input and an output and a multiplexer having inputs and an output, the input of the delay buffer being connected to one of the inputs of the multiplexer.

13. A method for testing the operability of a delay locked loop circuit, the method comprising:
    controlling a tap selector of the delay locked loop circuit to apply tap signals to columns of an array of delay elements of the delay locked loop circuit to selectively set the delay elements to operating states such that a signal is expected to propagate from an input node of the array to an output node of the array along a signal path provided by the delay elements;

applying a test signal from a test signal source to the input node of the array of delay elements;

receiving an output test signal from the output node of the array of delay elements;

determining whether any of the delay elements is not properly operating using the output test signal;

applying a second test signal from a second test signal source to rows of the array of delay elements, the second test signal being different that the test signal;

controlling the tap selector of the delay locked loop circuit to apply different tap signals to the columns of the array of delay elements to selectively set the delay elements of each column to a particular operating state;

receiving a second output test signal from the output node of the array of delay elements;

determining whether the tap selector is not properly operating using the second output test signal; and labeling the delay locked loop circuit as inoperable in response to the determining of whether any of the delay elements is not properly operating and the determining of whether the tap selector is not properly operating.

14. The method of claim 13 wherein the applying of the test signal includes controlling a flip-flop to provide the test signal to the input node of the array of delay elements.

15. The method of claim 13 wherein the applying of the test signal includes controlling a first flip-flop to provide the test signal to the input node of the array of delay elements, and wherein the applying of the second test signal includes controlling a second flip-flop to provide the second test signal to the rows of the array of delay elements.

16. The method of claim 13 wherein the controlling of the tap selector of the delay locked loop circuit to apply the different tap signals includes controlling the tap selector of the delay locked loop circuit to sequentially apply a unique tap signal to each column of the array of delay elements to sequentially set the delay elements of each column to a specific operating state.

* * * * *